United States Patent [19]

Whitfield

[11] Patent Number: 4,876,697
[45] Date of Patent: Oct. 24, 1989

[54] THREE-PART DECODER CIRCUIT
[75] Inventor: Arthur A. Whitfield, Rochester, N.Y.
[73] Assignee: Eastman Kodak Company, Rochester, N.Y.
[21] Appl. No.: 206,553
[22] Filed: Jun. 14, 1988
[51] Int. Cl.$^4$ .................. H04L 25/49; H03K 7/08
[52] U.S. Cl. ........................... 375/22; 375/20; 375/100; 360/40; 360/51
[58] Field of Search ............. 375/20, 22, 23, 17, 375/110; 360/44, 51; 340/825.63, 825.64; 329/106, 107; 364/200

[56] References Cited
U.S. PATENT DOCUMENTS 3,524,200  8/1970  Humpage et al. ............. 340/825.63
4,357,634  11/1982  Chung ................................ 360/40
4,592,072  5/1986  Stewart .............................. 375/55
4,689,802  8/1987  McCambridge ................... 375/22

Primary Examiner—Benedict V. Safourek
Assistant Examiner—Tesfaldet Bocure
Attorney, Agent, or Firm—Stephen C. Kaufman

[57] ABSTRACT

Novel electrical circuits suitable for decoding an encoded binary data stream. The electrical circuits include digital circuitry, and are preferably employed to decode magnetic information or optical information. The information has been encoded in a three-part code format according to a method which features self-clocking, velocity insensitive encoding and decoding. The novel electrical circuits decode the encoded information, and preserve the self-clocking velocity insensitive features of the novel method.

6 Claims, 3 Drawing Sheets

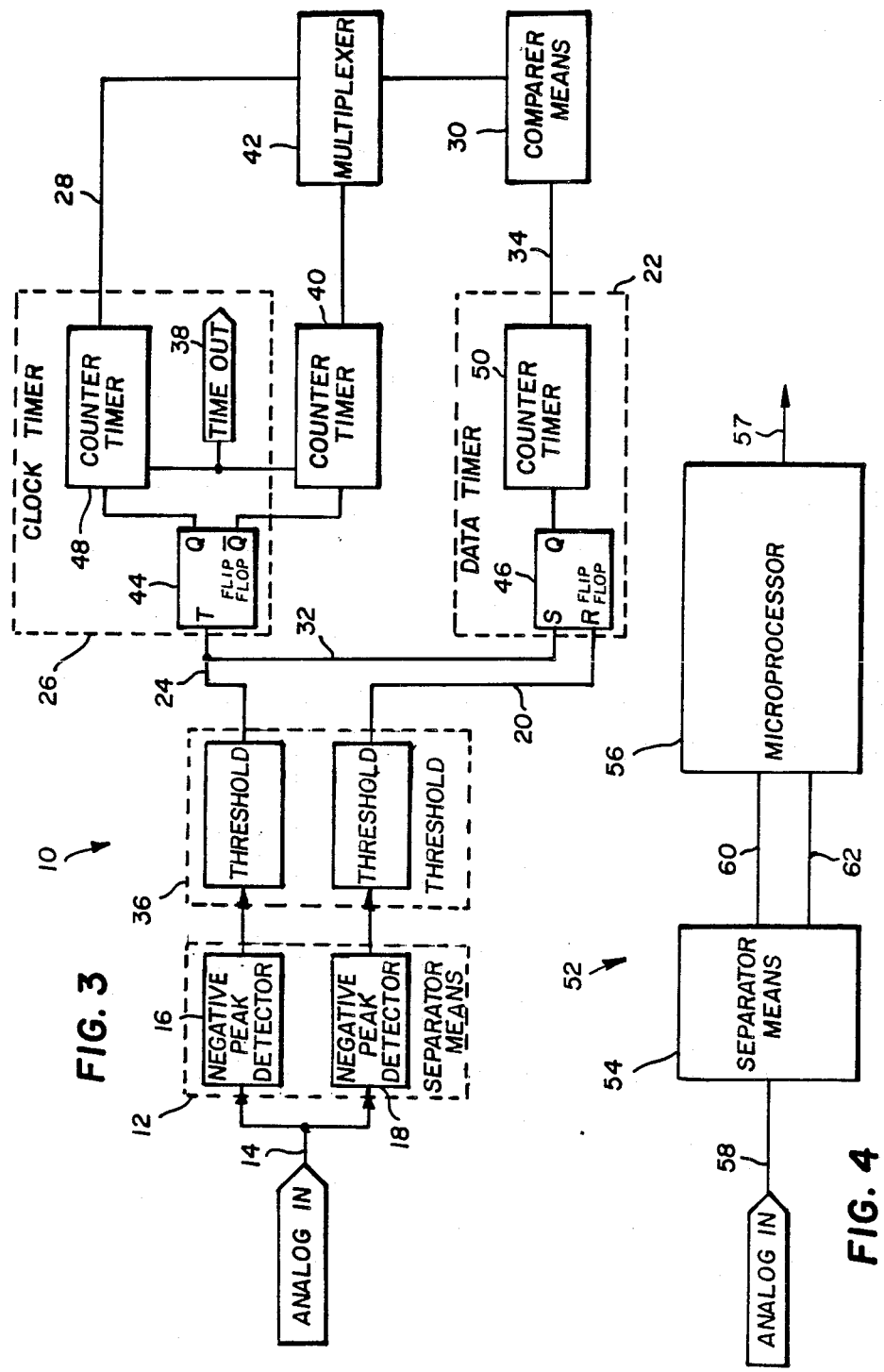

THREE-PART DECODER CIRCUIT

CROSS-REFERENCE TO A RELATED APPLICATION

This application is related to Application Ser. No. 206,646 filed June 14, 1988, by Wash, Application Ser. No. 206,408 filed June 14, 1988, by Whitfield et al., and Application Ser. No. 206,407 filed June 14, 1988, by Wash, which Applications are being filed contemporaneously with the application. The entire disclosures of each of these applications are incorporated by reference herein. Each of these applications is copending and commonly assigned.

FIELD OF THE INVENTION

This invention relates to electrical circuits suitable for decoding an encoded binary data stream

INTRODUCTION TO THE INVENTION

A novel method for modulating a binary data stream into a code format suitable for encoding an decoding e.g., magnetic or optical information, is disclosed in the above-cited Application Ser. No. 206,646 to Wash. The novel method features self-clocking, velocity insensitive encoding and decoding. The Wash disclosure states that preferred electrical circuits that may be employed for realizing the decoding scheme set forth in that disclosure are provided in the present application. This application, therefore, provides novel electrical circuits that may be advantageously employed, for example, in decoding an encoded binary data stream. In particular, the novel electrical circuits include digital circuitry, and are preferably employed to decode magnetic information or data that has been encoded in a three-part code format in accordance with the Wash disclosure. The novel electrical circuits decode the encoded information, and preserve the self-clocking, velocity insensitive features of the novel method.

SUMMARY OF THE INVENTION

In one aspect, the invention provides an electrical circuit suitable for decoding a binary data steam that has been encoded in a sequential bitcell code format, the encoding resulting in an encoded signal waveform that carries clock information and data information, which electrical circuit comprises:
  (a) a separator means
    (i) for inputting the encoded signal waveform and separating the clock information from the data information, and
    (ii) for generating an output clock signal pulse train, and an output data signal pulse train;
  (b) a clock timer for inputting the clock signal pulse train and generating a clock parameter CP that is a measure of the time demarked between a first and a second clock signal pulse;
  (c) a data timer for inputting the data signal pulse train, and the clock signal pulse train, and at the advent of the first clock signal pulse, generating a data parameter that is a measure of the time demarked between the first clock signal pulse and a first data signal pulse; and
  (d) a comparer means for
    (i) inputting the clock parameter
    (ii) inputting the data parameter,
    (iii) generating a parameter CP/2, and
    (iv) assigning a decoded signal a first valuation if the data parameter is less than CP/2, and a second valuation if the data parameter is greater than CP/2.

As mentioned above, the novel electrical circuit as defined preserves the self-clocking, velocity insensitive features of the Wash method for encoding and decoding information. This preservation factor is provided by the electrical circuit in the following way. In the general case, the electrical circuit inputs the encoded signal waveform, which waveform comprises sequential bitcells defined by a variable time duration $\Delta t$. This variable time duration $\Delta t$ is a consequence of the information transfer rate in the encoding and decoding process being dependent on unpredictable and variable transfer rate velocities and accelerations. The present electrical circuit accommodates such unpredictable and variable transfer rates by way of e.g., the clock timer. The clock timer generates the clock parameter CP that is a measure of the time demarked between the first and second clock signal pulses, which demarked time corresponds to the variable time $\Delta t$. At the same time, the data timer receives the first clock signal pulse, in order to initiate the generating of the data parameter. This coordination of clock timer/data timer instruction helps provide the self-clocking capability. Moreover, the data parameter is a measure of an instantaneous bitcell data signal pulse "location" that occurs between two successive clock signal pulses of variable time $\Delta t$. This data signal pulse "location" itself corresponds to a variable time duration, as defined by the time between the first clock signal pulse and a subsequent data signal pulse. Hence, the data parameter is velocity insensitive to expansions or contractions between two successive clock signal pulses of variable time $\Delta t$. Finally, the comparer means also acts in cooperation with the clock timer and the data timer, to the end of accommodating the variable sequential bitcell time $\Delta t$. The comparer means does this by assigning the decoded signal first and second valuations based on the clock parameter and the data parameter, which parameters are now shown to immanently preserve the self-clocking, velocity insensitive features of the Wash method.

I now turn to preferred aspects of the electrical circuit as defined.

Preferably, the separator means separates the encoded signal waveform in accordance with the method of encoding, and subsequent reading of the encoded signal waveform.

To this end, the separator means preferably comprises:
  (a) a first detector for detecting the encoded signal waveform for the clock information, and
  (b) a second detector for detecting the encoded signal waveform for the data information, the second detector being connected in parallel with the first detector.

An encoded signal waveform preferably encodes data information by assigning it a positive polarity, and on the other hand, encodes clock information by assigning it a negative polarity. The separator means, accordingly, preferably separates the clock information from the data information by detecting waveform peaks i.e., positive pulses or data information, and waveform valleys i.e., negative pulses or clock information. The separator means operates on a succession of bitcells, and preferably generates an output pulse train that represents the sequential clock signals, and an output pulse train that represents the sequential data signals.

The clock timer preferably comprises a digital timing circuit. The digital timing circuit may comprise a properly programmed microprocessor, which can perform timing via counting for digital signals applied to inputs on the microprocessor. On the other hand, the digital timing circuit may comprise a discrete digital counter.

The data timer preferably comprises a digital timing circuit. The digital timing circuit may comprise a properly programmed microprocessor, which can perform timing via counting for digital signals applied to inputs on the microprocessor. On the other hand, the digital timing circuit may comprise a discrete digital counter.

The comparer means preferably comprises a programmed microprocessor to assign the decoded signal first and second valuations. On the other hand, and to the same end, the comparer means can comprise digital circuits.

In another aspect, the invention provides an electrical circuit suitable for decoding a binary data stream that has been encoded in a sequential bitcell code format, the encoding resulting in an encoded signal waveform that carries clock information and data information, which electrical circuit comprises:

(a) a separator means
  (i) for inputting the encoded signal waveform and separating the clock information from the data information, and
  (ii) generating an output clock signal pulse train, and an output data signal pulse train; and
(b) a microprocessor that inputs the clock signal pulse train and the data signal pulse train, the microprocessor comprising a program that
  (i) generates a clock parameter CP that is a measure of the time demarked between a first and second clock signal pulse;
  (ii) generates a data parameter that is a measure of the time demarked between the first clock signal pulse and a first data signal pulse;
  (iii) generates a parameter CP/2; and
  (iv) assigns a decoded signal a first valuation if the data parameter is less than CP/2, and a second valuation if the data parameter is greater than CP/2.

BRIEF DESCRIPTION OF THE DRAWINGS

The invention is illustrated in the accompanying drawing, in which FIGS. 1A-E provide signal waveforms that explain the operation of the invention, and FIGS. 2, 3 and 4 show electrical circuits of the invention.

DETAILED DESCRIPTION OF THE INVENTION

Important aspects of the Wash application Ser. No. 206,646, which discloses the novel method for encoding and decoding binary information, are first reviewed from a perspective that will facilitate a clear understanding of the electrical circuits of the present invention. In one aspect, the novel method comprises the steps of (1) defining a bitcell as the time $t_i$ between two adjacent clock transitions;
(2) writing a first clock transition at the beginning of the bitcell; and
(3) encoding a binary data transition after the first clock transition in the ratio of $t_d, t_i$, where $t_d$ is the time duration between the first clock transition and the data transition, with the proviso that $$\frac{t_d}{t_i} \neq \tfrac{1}{2}.$$

Information that has been encoded pursuant to this method may have an encoded waveform exemplified by FIG. 1a. FIG. 1a shows a sequence of bitcells. Each bitcell is defined by a variable time $t_i$ between two adjacent clock transitions. Within each bitcell, a data 0 bit or a data 1 bit has been encoded in accordance with the ratio $t_d/t_i$, as defined. For illustration purposes, a data 0 bit has been encoded by the ratio $$\frac{t_d}{t_i} < \tfrac{1}{2},$$

and a data 1 bit has been encoded by the ratio $$\frac{t_d}{t_i} > \tfrac{1}{2}.$$

As is well known to those skilled in the art, the method of decoding the encoded waveform of magnetic systems first requires the employment of a magnetic reader. The magnetic reader, in turn, may provide a time derivative encoded waveform of that shown in FIG. 1A. This time derivative encoded waveform is shown in FIG. 1B. Observe that FIG. 1B shows an analog encoded waveform, comprising (albeit in a different form from FIG. 1A) the clock information mixed in with the data information In particular, FIG. 1B shows that each bitcell is defined by the variable time $t_i$, and that the clock information comprises negative pulses or valleys, and that the data information comprises positive pulses or peaks.

Turning again to the Wash method, we are informed that the encoded waveform of FIG. 1B may be decoded by the step of determining the time between the first clock transition and the data transition, and comparing this time to the variable bitcell time $t_i$. Preferred circuitry for realizing this step is shown in FIG. 2.

Figure 1:
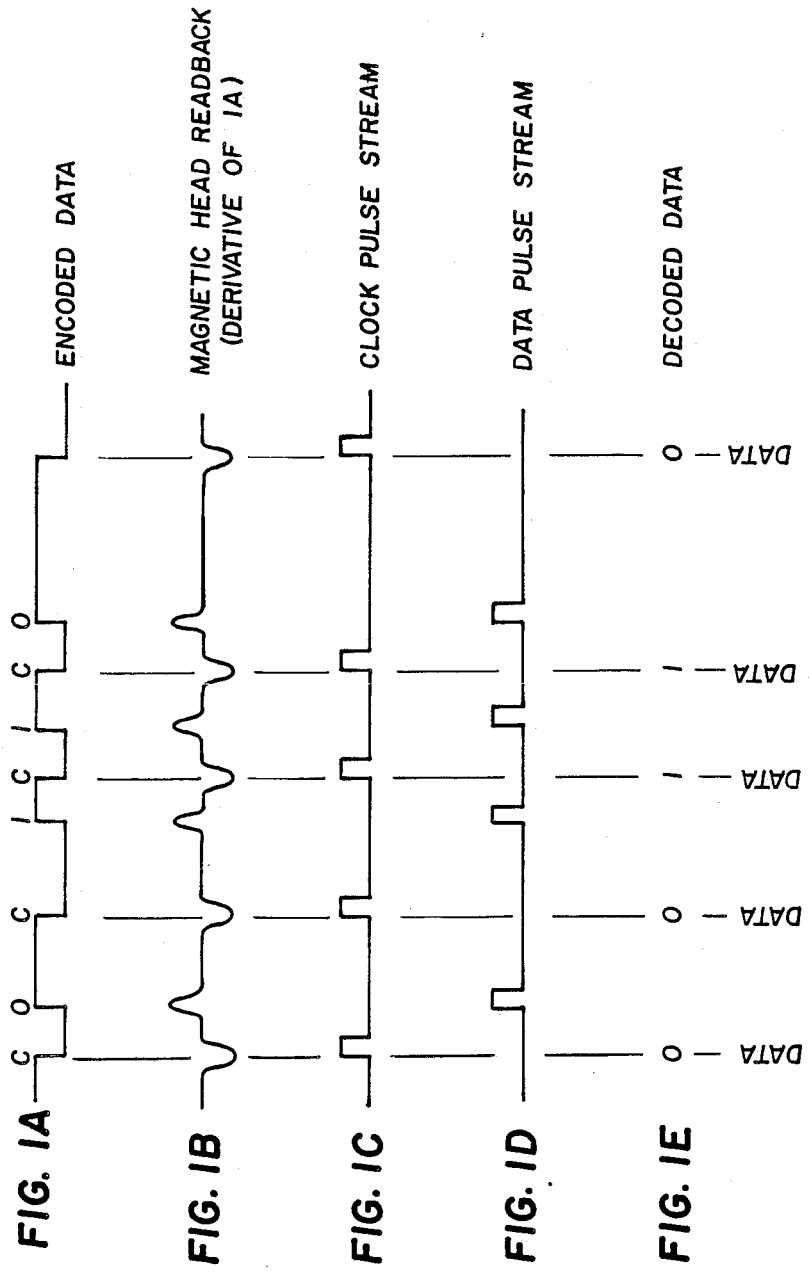
Figure 2:
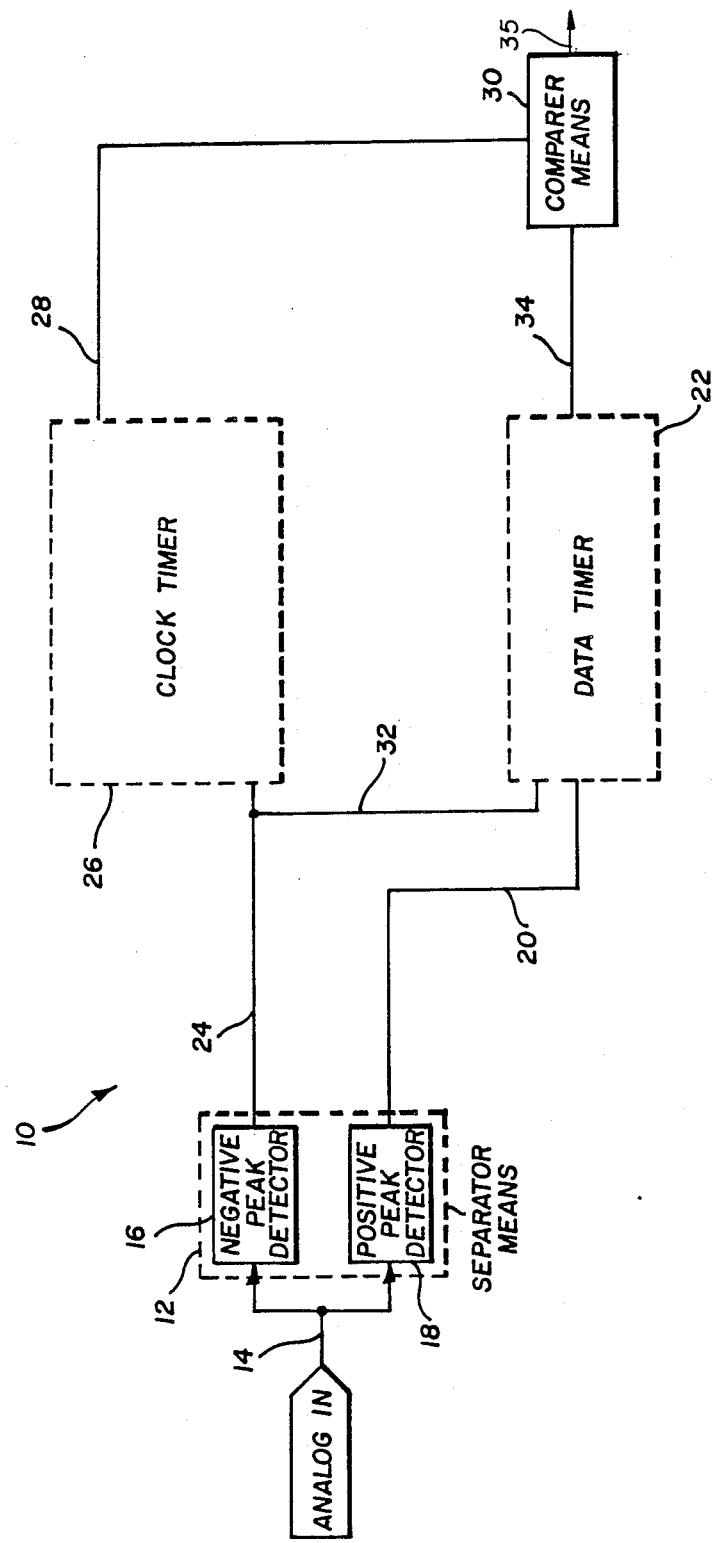

FIG. 2 shows an electrical circuit 10 suitable for decoding the encoded signal waveform that carries clock information and data information i.e., the waveform of FIG. 1B. The structure of the electric circuit 10 is as follows. The electrical circuit 10 comprises a separator means 12 that receives the encoded signal waveform along a line 14. The separator means 12, in turn, comprises a negative peak detector 16, and a positive peak detector 18 connected in parallel with the negative peak detector 16. Continuing, the positive peak detector 18 is connected in series along a line 20 to a data timer 22. The negative peak detector 16, on the other hand, is connected in parallel to the data timer 22 along a line 32, and in series along a line 24 to a clock timer 26. The clock timer 26, in turn, is connected in series along a line 28, to a comparer means 30. Finally, the data timer 22 is connected in series to the comparer means 30 along a line 34.

The operation of the FIG. 2 electrical circuit 10 is now explained, with continued reference to the signal waveforms shown in FIG. 1, and with subsequent reference to FIGS. 3 and 4.

To begin, the encoded waveform comprising clock information mixed in with the data information (FIG. 1B), is provided as an input along the line 14 to the separator means 12. The separator means 12 provides an output clock signal (CS) and an output data signal, for each of a succession of bitcells. In particular, the separator means 12 accomplishes this way of the negative peak detector 16, that detects the encoded signal waveform for clock-information, and the positive peak detector 18, that detects the encoded signal waveform for data information. In particular, the negative peak detector 16 detects the encoded signal waveform for valleys, or negative pulses, and the positive peak detector 18 detects the encoded signal waveform for peaks, or positive pulses. The detector 16 outputs a clock signal (CS) pulse train (see FIG. 1C) for input along the line 24 to the clock timer 26, and for input along the line 32 to the data timer 22. The detector 18, on the other hand, outputs a data signal pulse train (see FIG. 1D) for input to the data timer 22 along the line 20.

Treatment of the data signal pulse train in the data timer 22 is disclosed below. For now, we turn to the continued analysis of the clock signal pulse train as it is inputted to the clock timer 26. The clock timer 26 generates a clock parameter CP that is a measure of the time demarked between a first and a second clock signal pulse. For illustration purposes, assume that a first and second clock signal pulse define a CP that is equal to 100 units. In other cases, that is, for other bitcells, CP may be equal to say, 106 units, or 90 units. In all cases, the clock timer 26 generates the clock parameter CP, for input along the line 28 to the comparer means 30. The clock timer 26 is then reset to 0 units. By way of example, a suitable clock timer 26 may be constructed using conventional digital counter circuits and oscillators.

As just indicated, the clock timer 26 initiates its counting upon the advent of the first clock signal pulse. This first clock signal pulse is also inputted to the data timer 22 along the line 32. By this action, the data timer 22 begins to count, and it continues to count until it receives a sequential data signal pulse along the line 20. The final count corresponds to the data parameter. For illustration purposes, assume that the data parameter is equal to 70 units for a first bitcell, and equal to 36 units for a second bitcell. In either case, the data timer 22 generates the data parameter for input along the line 34 to the comparer means 30. The data timer 22 is then reset to 0 units. By way of example, a suitable data timer 22 may be constructed using conventional digital counter circuits, oscillators and logic circuits.

If we now recall the Wash method decoding step, namely, determining the time between the first clock transition and the data transition, and comparing this time to the variable bitcell time $t_i$, it is clear that the electrical circuit 10 has provided all the necessary information in order to finally realize the decoding step in the comparer means 30. The comparer means 30, it is recalled, inputs the clock parameter CP along the line 28, and the data parameter along the line 34. The comparer means 30 generates a new parameter, means CP/2. The importance of the parameter CP/2 is that it provides an indication of the halfway point of each bitcell. The comparer means 30 compares the data parameter for each bitcell, with that bitcell's parameter CP/2. The comparer means 30 assigns a decoded signal a first valuation if the data parameter is less than CP/2, and a second valuation if the data parameter is greater than CP/2, and outputs this information on a line 35.

It is helpful to restate the operation of the comparer means 30, with reference to FIGS. 1e an da. FIG. 1e shows decoded data information for sequential bitcells; the information was previously embedded in the encoded waveform of FIG. 1a. Recall from above that for purposes of illustration in FIG. 1a, we encoded a data 0 bit by the ratio $$\frac{t_d}{t_i} < \tfrac{1}{2},$$

and a data 1 bit by the ratio of $$\frac{t_d}{t_i} > \tfrac{1}{2}.$$

The comparer means 30, in accordance with this illustration, assigns the decoded signal a first valuation of data 0, when the data parameter is less than CP/2, and a second valuation of data 1, when the data parameter is greater than CP/2. For example, assume than the clock parameter for a given bitcell is 100 units (as determined by the clock timer 26), and that the data parameter is 70 units (as determined by the data timer 22). Then, the comparer means 30 computes the parameter CP/2 = 50 units. Since the data parameter 70 units is greater than CP/2=50 units, the comparer means 30 assigns the decoded signal the second valuation of data 1.

Attention is now directed to FIG. 3, which shows the electrical circuit 10 of FIG. 2, as well as a threshold circuit 36, a time out circuit 38, a counter timer 40, a multiplexer 42, a first logic circuit 44, and a second logic circuit 46. These added components are preferred for the following reasons.

First, the threshold circuit 36, connected as shown between the separator means 12 and the clock timer 26 and the data timer 22, may be employed to suppress noise embedded in the FIG. 1b waveform, to minimize the effects of amplitude changes in the FIG. 1b waveform, and/or to provide a digital variant of the FIG. 1b waveform.

Second, the time out circuit 38, connected as shown as an output to the clock timer 26, preferably is employed to address the following problem. In operation, the electrical circuit 10 may input sequential bitcells of unacceptably long duration. Or, a sequential bitcell string may simply come to an end. In either case, the time out circuit 38 may be used to disable further input to the clock timer 26 after a preselected interval.

Third, the counter timer 40 and multiplexer 42, connected as shown between the clock timer 26, the comparer means 30 and the first logic circuit 44, address the following problem. Recall that the clock timer 26 inputs the FIG. 1c clock signal pulse train, and generates the clock parameter CP that is a measure of the time demarked between a first and second clock signal pulse. This capability implicitly suggests that a second clock signal pulse stops the clock timer 26 from counting, and, at the same time, initiates the start of the next bitcell. This situation suggests an instantaneous overlap of functions. The solution to this problem of overlapping functions may be provided by the counter timer 40/multiplexer 42 in combination with the logic circuit 44. In brief, by way of the first logic circuit 44, which comprises a toggle flip-flop, the multiplexer 42 switches from a counter timer 48 to the independent, but otherwise functionally equivalent counter timer 40, per alternate bitcells. Note that in alternative embodiments, for example where a suitable microprocessor is employed at this stage of the electrical circuit, or equivalent logic hardware, there may be enough time to process the clock timer 26 clock parameter and restart counting for a sequential bitcell, without the necessity for employing the counter timer 40/multiplexer 42.

Fourth, the second logic circuit 46, comprising a suitable set-reset flip-flop, functions to implement one of the stated objectives of the clock timer 26 specified above. Namely, the second logic circuit 46 helps provide the instruction to the data timer 22, in particular, to a counter timer 50, to the end that it should begin counting.

The operation of the electrical circuit 10 has been predicted on the following criteria:

encoded signal waveform of FIG. 1b, separates the clock information from the data information, and outputs along a line pair 60, 62, an output clock signal pulse train and an output data signal pulse train, for input to the microprocessor 56. The microprocessor 56, in turn, comprises a program that (i) generates a clock parameter CP that is a measure of the time demarked between a first and second clock signal pulse;

(ii) generates a data parameter that is a measure of the time demarked between the first clock signal pulse and a first data signal pulse;

(iii) generates a parameter CP/2; and (iv) assigns a decoded signal a first valuation if the data parameter is less than CP/2, and a second valuation if the data parameter is greater than CP/2.

By way of example, a suitable routine to this end, written in BASIC, is now listed

| 10  | REM ****ROUTINE FOR DECODING      | THREE-PART ENCODED DATA STREAMS*** |
|-----|-------------------------------------|--------------------------------------|
| 20  | A=INP(XXX)                          | look at input port xxx               |
| 30  | IF A AND CLKMASK THEN GOTO 40       | look for CLOCK to go high            |
| 40  | GOTO 10                             | loop if no clock                     |
| 50  | TOGGLE=0                            | force first pass through loop        |
| 60  | WHILE NOT TOGGLE                    | loop for counting                    |
| 70  | CLKCTR=CLKCTR+1                     | start timing CLOCKS (bitcell length) |
| 80  | DATCTR=DATCTR+1                     | start timing DATA on first CLOCK     |
| 90  | B=INP(xxx)                          | look at input port xxx               |
| 100 | IF B and DATMASK THEN DP=DATCTR     | stop timing DATA (data parameter)    |
| 110 | IF B and CLKMASK THEN CP=CLKCTR:TOGGLE=1 | stop timing CLOCKS (clock parameter) |
| 120 | WEND                                | repeat loop until second CLOCK       |
| 130 | HALF=CP/2                           | define ½ bit cell                    |
| 140 | DATAPOSITION=HALF-DP                | determine data position              |
| 150 | IF DATAPOSITION > 0 THEN DATABIT(I)=0 | assign digital value               |
| 160 | IF DATAPOSITION < 0 THEN DATABIT(I)=1 | assign digital value               |
| 170 | ELSE DATABIT(I)=9                   | flag bad DATABIT                     |

(1) the FIG. 1a clock transition pulses are the opposite polarity of the data pulse. In particular, the clock transition pulses are negative; the data transition pulses are positive. in other circuit embodiments, not shown, these polarities may be reversed, while still uniquely differentiating the clock transition pulses from the data pulse. Recall that this feature provides self-clocking, which, in turn, permits velocity insensitive encoding and decoding.

(2) the FIG. 1a, for the purposes of illustration, and pursuant to the Wash method, encodes a data 1 bit logic transition at the 1 time location, and a data 0 bit logic transition at the 0 time location (see the Whitfield et al. Application for more details on this encoding realization). In other circuit embodiments, not shown, these locations may be reversed.

(3) the circuit 10 makes use of e.g., separator means, clock timers, and logic circuits. Conventional such components can be used for this purpose.

(4) with respect to sub-paragraphs 1 to 3, as well as the entire disclosure, those skilled in the art will have no difficulty, having regard to the disclosure herein and their own knowledge, in making and using the invention and in obtaining the advantages of the various embodiments.

Attention is now directed to FIG. 4 which shows another aspect of the present invention, namely, an electrical circuit 52 comprising a separator means 54 and a microprocessor 45 and an output line 57. In particular, the separator means 54 inputs along a line 58 the

What is claimed:

1. An electrical circuit suitable for decoding a binary data stream that has been encoded in a sequential bitcell code format, the encoding resulting in an encoded signal waveform that carries clock information and data information, which electrical circuit comprises:

(a) a separator means
  (1) for inputting the encoded signal waveform and separating the clock information and the data information, and
  (ii) for generating an output clock signal pulse train, and an output data signal pulse train;

(b) a clock timer for inputting the clock signal pulse train and generating a clock parameter CP that is a measure of a time elapsed between a first and a second clock signal pulse, for each of a succession of bitcells;

(c) a data timer for inputting the data signal pulse train, and the clock signal pulse train, and at the advent of the first clock signal pulse, generating a data parameter that is a measure of a time elapsed between the first clock signal pulse and a first data signal pulse, for each of a succession of bitcells; and (d) a comparer means for
  (i) inputting the clock parameter CP,
  (ii) inputting the data parameter,
  (iii) generating a parameter CP/2, and (iv) generating a decoded output signal, the decoded output signal being assigned a first valuation if the data parameter is less than CP/2, and a second valuation if the data parameter is greater than CP/2.

2. An electrical circuit according to claim 1, wherein the separator means comprises:
   (a) a first detector for detecting the encoded signal waveform for the clock information, and
   (b) a second detector for detecting the encoded signal waveform for the data information, an input to the second detector being connected in parallel with an input to the first detector.

3. An electrical circuit according to claim 1, wherein the clock timer comprises a digital timing circuit.

4. An electrical circuit according to claim 1, wherein the data timer comprises a digital timing circuit.

5. An electrical circuit according to claim 1, wherein the comparer means comprises a programmed microprocessor.

6. An electrical circuit according to claim 1, wherein the comparer means comprises digital circuits.

* * * * *